United States Patent [19]

Holland

[11] Patent Number: 4,703,275
[45] Date of Patent: Oct. 27, 1987

[54] METHOD AND APPARATUS TO COMPENSATE FOR EDDY CURRENTS IN MAGNETIC RESONANCE IMAGING

[75] Inventor: G. Neil Holland, Chagrin Falls, Ohio

[73] Assignee: Picker International, Inc., Highland Hts., Ohio

[21] Appl. No.: 758,761

[22] Filed: Jul. 25, 1985

[51] Int. Cl.$^4$ ............................................. G01K 33/20
[52] U.S. Cl. .................................... 324/318; 324/322; 324/313
[58] Field of Search ............... 324/318, 319, 320, 322, 324/313, 307, 309, 300, 225

[56] References Cited

U.S. PATENT DOCUMENTS

| | | | |
|---|---|---|---|
| 3,792,345 | 2/1974 | Hawkins | 324/322 |
| 4,005,358 | 1/1977 | Foner | 324/228 |
| 4,284,948 | 8/1981 | Young | 324/309 |
| 4,300,096 | 11/1981 | Harrison et al. | 324/309 |
| 4,307,344 | 12/1981 | Walters | 324/307 |
| 4,315,216 | 2/1982 | Clow et al. | 324/309 |
| 4,386,318 | 5/1983 | Burbank et al. | 324/225 |
| 4,585,995 | 4/1986 | Flugan | 324/322 |

FOREIGN PATENT DOCUMENTS

| | | |
|---|---|---|
| 8403773 | 9/1984 | European Pat. Off. |
| 8404173 | 10/1984 | European Pat. Off. |
| 0161366 | 11/1985 | European Pat. Off. |
| 2053481 | 2/1981 | United Kingdom |

OTHER PUBLICATIONS

V. D. Skirda et al., Noise-Pulse Generator for NMR Measurements of Self-Diffusion According to the Pulsed Gradient Method, Instruments and Experimental Techniques vol. 19, No. 3, pt. 1, May–Jun. 1976, pp. 750–752.

B. E. Ryshchar, Simulator for Video Pulse Signals with Specified Envelope Form, Instrum. and Exp. Tech., vol. 24, No. 1, Jan.–Feb. 1981 pp. 152–155.

"NMR Imaging: Image Recovery Under Magnetic Fields with Large Non-Uniformities" by Hutchison, et al., 1978 Sci. Instrum., vol. 11, 1978 pp. 217–221.

*Primary Examiner*—Stewart J. Levy
*Assistant Examiner*—Scott M. Oldham
*Attorney, Agent, or Firm*—Fay, Sharpe, Beall, Fagan, Minnich & McKee

[57] ABSTRACT

An electronic module for generating gradient energization signals in magnetic resonance imaging to correct for eddy current effects. An energization profile is modified by an amount related to the magnitude of eddy current fields generated in the vicinity of a gradient coil. This modification produces an energization profile resulting in a gradient magnetic field corresponding to the magnetic field the unmodified energization profile would have produced but for the presence of induced eddy currents.

5 Claims, 7 Drawing Figures

INPUT (AND DESIRED WAVEFORM)

OUTPUT FIELD

MODIFIED INPUT

OUTPUT FIELD

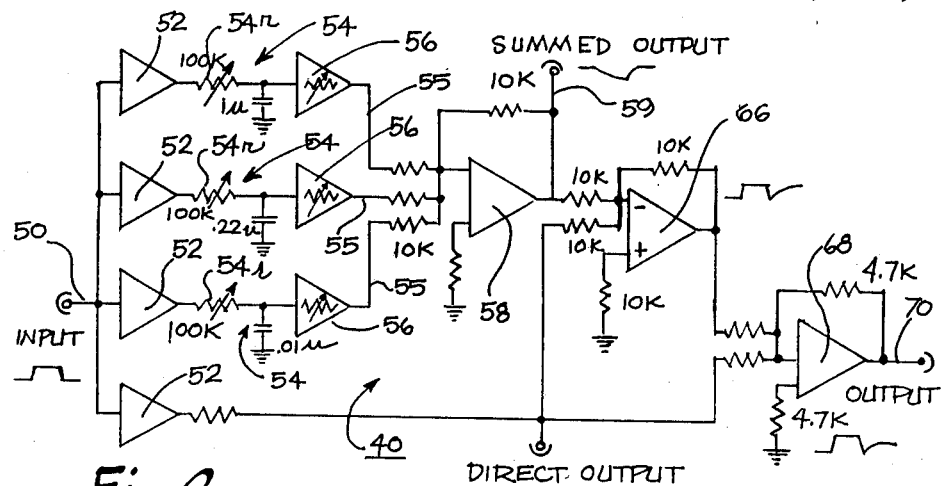
Fig. 2
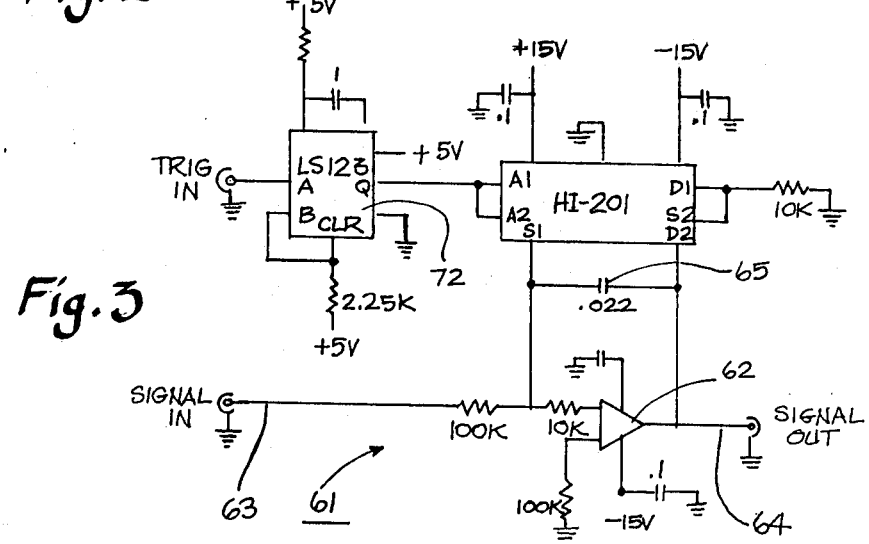
Fig. 3
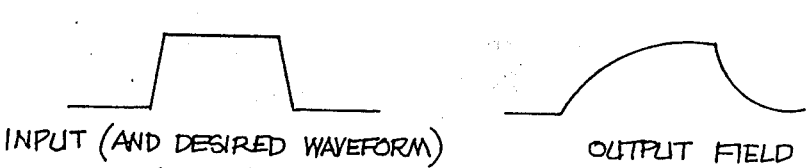
INPUT (AND DESIRED WAVEFORM)
Fig. 4A
OUTPUT FIELD
Fig. 4B
MODIFIED INPUT
Fig. 4C
OUTPUT FIELD
Fig. 4D

METHOD AND APPARATUS TO COMPENSATE FOR EDDY CURRENTS IN MAGNETIC RESONANCE IMAGING

DESCRIPTION

Technical Field

The present invention relates generally to magnetic resonance imaging and more particularly to a gradient field producing method and apparatus that offsets effects induced eddy currents have on those fields.

Background Art

Magnetic resonance imaging procedures are used to noninvasively produce medical diagnostic information. With such a procedure a patient is positioned in an aperture of a large annular magnet. The magnet produces a strong and static magnetic field which forces hydrogen and other chemical elements in the patient's body into alignment with the static field.

When diagnostic information is to be produced a series of radio frequency (RF) pulses are applied orthogonally to the static magnetic field. These RF pulses are at the resonant frequency of the chemical element of interest. For human diagnosis with currently accepted procedures the RF pulses are at the resonant frequency of hydrogen which is abundantly present in a human because of the high percentage of water in a body. The RF pulses force the hydrogen molecules from their magnetically aligned positions and cause the molecules to precess or "wobble" in a motion akin to that of a spinning top as it is reaching the conclusion of a spin. This molecular precession is sensed to produce electrical signals, known as free induction decay signals, that are used to create diagnostic images.

In order to create an image of a plane of patient cross-section, it is necessary to differentiate between hydrogen molecules in the plane and those in other regions. Gradient fields are superimposed on the high strength static field for the accomplishment of this differentiation.

Gradient coils are also pulsed to produce magnetic flux orthogonal to the static field. To produce an image, now standard two dimensional Fourier transform encoding techniques utilize a phase encoding gradient field generated by the gradient coils in timed relationships with application of an RF pulse to a region of interest. Transitions of magnetic moments within the region are monitored as the encoding gradients are applied. After this transition data is collected, a two dimensional Fourier transform reconstruction process is performed to form an image of structure variation within the subject.

The phase encoding gradient fields are typically applied in the form of pulses lasting from 1 msec. to 200 msec. The magnitudes of these pulses are typically 0.5 to 10 mT·m$^{-1}$. Such gradient field pulses are generated by gradient field coils mounted on a cylindrical form which is inserted into the static magnetic field. These gradient field coils are energized by suitable high power current sources.

It is known that when a gradient field coil is energized the field that is produced will not exactly correspond to an energization current waveform if the coil is placed in proximity to metal objects. This lack of correspondence is due to the effect of eddy currents induced in the metal objects. Eddy current magnitude depends on the amount and conductivity of the material in which eddy currents are induced, the proximity of this material to the gradient field coil, and the magnitude of the pulsed field. Eddy current attenuation over time is predominantly determined by the conductivity of the material in which the eddy currents are induced.

Eddy currents have the effect of "low-pass" filtering the gradient field compared to the input waveform used to produce that field. In magnetic resonance imaging such eddy currents hinder the production of high quality diagnostic scans. Ideally, the gradient field waveforms are substantially flat when 'on' and flat and zero when 'ff'. Fields produced by the eddy currents round off the sharp edges of this ideal response to gradient coil energization.

Proposals have been made to modify the energization input to the gradient coil to correct for eddy current effects. This modification is accomplished by exponentially weighting the input signal an amount to offset the effects of the eddy currents. Since the waveform input is usually generated by computer, it is possible to use software techniques to generate appropriate modifications. To perform these modifications a method of measuring the magnitude of eddy currents is needed so that changes to a given input profile can be instituted.

The large number of different waveforms used in magnetic resonance imaging make computer correction of this problem difficult if not impossible. The various metallic components placed within the uniform field have a variety of conductivities which generate eddy currents with a variety of time constants. Under these circumstances a gradient field waveform becomes the summation of various exponentials having different time constants and magnitudes. This complexity makes the task of computer modeling of eddy current corrections extremely difficult.

DISCLOSURE OF INVENTION

In accordance with the invention, an electronic correction is implemented to take into account eddy currents induced by metallic objects in the vicinity of a gradient coil. A computer generated input corresponding to a desired field profile is modified to produce an output waveform which drives a high current amplifier to produce a field profile substantially equivalent to the computer generated input waveform.

The apparatus of the invention includes a circuit for sensing a magnetic field produced by gradient coil energization and a circuit for providing a signal related to the difference between the magnetic field that is sensed and a desired magnetic field. This difference signal is added to the coil energization signal to produce a modified energization signal that offsets the effects due to eddy currents induced in metallic objects within the vicinity of the coil.

The apparatus includes a tunable circuit with components that can be adjusted by a user. An adjustable signal generated by the tunable circuit is compared with a signal sensed in response to gradient coil energization. In a preferred embodiment the two signals are coupled to an oscilloscopes and the summation of the two signals displayed and adjusted until a flat waveform appears on the screen. When this occurs, the adjustable signal cancels the sensed signal.

Two summing amplifiers are then utilized to provide a modified coil energization signal. A first summing circuit subtracts the adjustable signal from the computer input to provide a difference signal which is then coupled to the summing input of the second amplifier. This second amplifier adds the difference signal to the computer input to provide a modified energization signal which produces a magnetic field the same as the magnetic field that would be produced, but for the presence of the metallic objects in the vicinity of the gradient coil.

This solution cannot be easily solved with computer modeling. The tunable circuit can be adjusted for any pulse input by viewing the oscilloscope screen, and adjusting the tunable circuit until the sensed and adjustable signals cancel.

A preferred tuning circuit has a plurality of adjustable amplifiers and resistor/capacitor circuits having outputs coupled together to form an input to the oscilloscope. The adjustable resistor-capacitor circuits allow the shape of the modified pulse signal to be tuned, and the adjustable amplifiers allow the gain to be modified to match the sensed signal.

One object of the invention is a technique for adjusting gradient coil energization to produce a gradient field that matches the input signal regardless of the presence of metallic objects in the vicinity of the gradient coil.

This and other objects, advantages and features of the invention will become better understood when a detailed description of a preferred embodiment of the invention is described in conjunction with the accompanying drawings.

BRIEF DESCRIPTION OF THE DRAWINGS

FIG. 2 is a schematic of a circuit for producing modified gradient coil energization signals;

FIG. 3 is a circuit used in sensing the magnetic field generated by gradient coil energization;

FIGS. 4A and 4B are input and output waveforms illustrating eddy current effects on field shape; and FIGS. 4C and 4D are input and output waveforms illustrating a modified gradient coil energization profile to correct for eddy current effects.

BEST MODE FOR CARRYING OUT THE INVENTION

Figure 1:
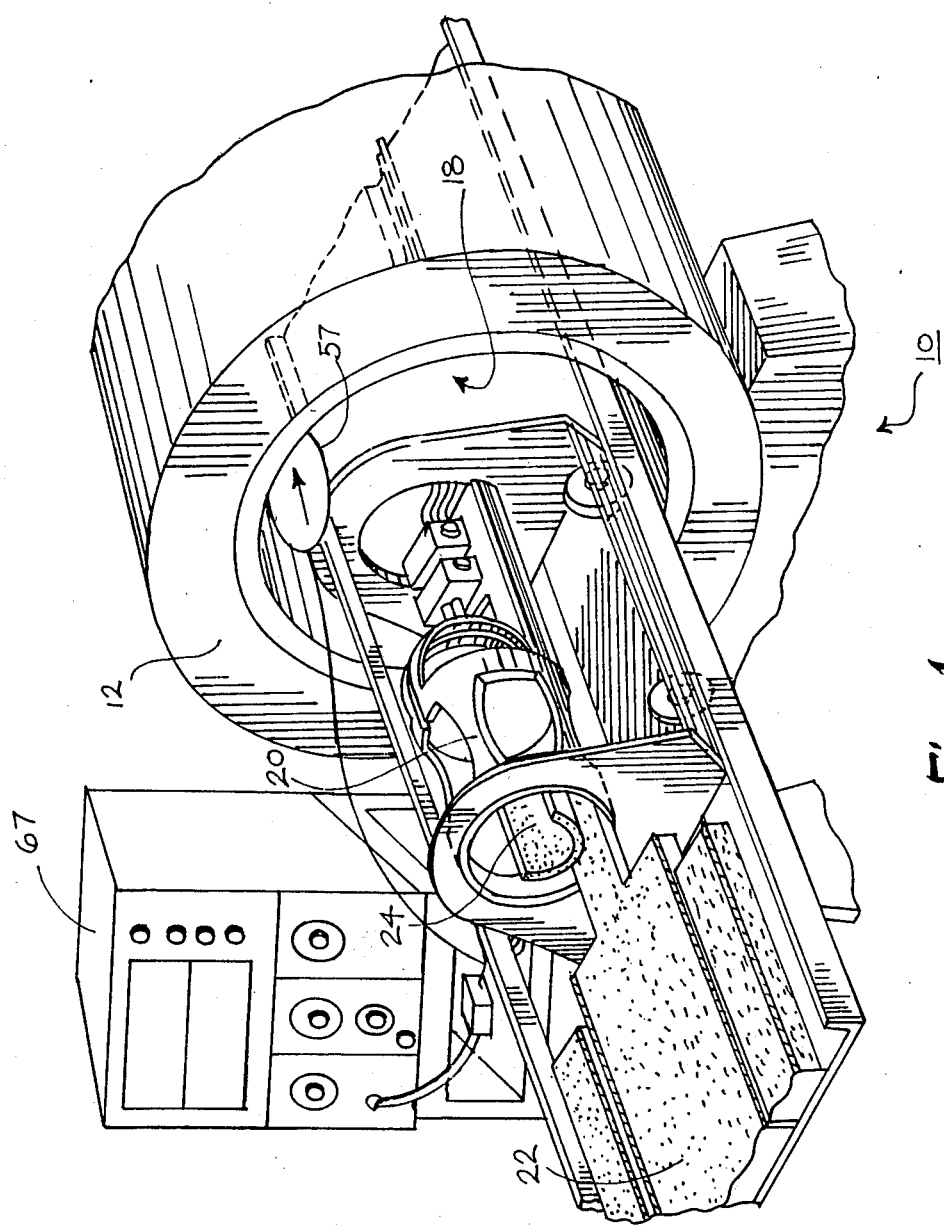
FIG. 1 is a perspective view of a nuclear magnetic resonance imaging system.

Turning now to the drawings, FIG. 1 illustrates a magnetic resonance imaging scanner 10 for determining internal structure of a subject. The scanner 10 includes a housing 12 which encloses a large encircling magnet for creating a high strength uniform magnetic field over a region of interest. Gradient fields are created by one or more gradient coils also mounted within the housing 12. The shape and positioning of these coils is such that a gradient field can be superimposed upon the static field in any desired orientation.

The housing 12 defines an opening 18 into which a subject is inserted for magnetic resonance scanning. FIG. 1 illustrates an rf pulse coil 20 for superimposing a perturbing field onto the high strength field of the encircling magnet. A patient support 22 having a headrest 24 is seen positioned in relation to the coil 20 so that the patient's head rests on the headrest 24. The coil 20, patient support 22 and patient are moved into the scanning aperture 18 for magnetic resonance imaging.

The coil 20 shown in FIG. 1 creates an rf magnetic field for realigning magnetic moments within a subject region of interest. The coil 20 also measures output signals from structure within the patient. These signals are produced by a response of structure within a patient to the combination of magnetic fields created by the high strength magnet, the gradient coils, and the pulse coil 20. Circuitry coupled to the coil 20 through cabling exiting from the rear of the scanner 10 energizes the pulse coil 20.

In accordance with known magnetic imaging techniques, a gradient field is superimposed on the high strength field to obtain sufficient information for imaging of the subject. The direction and magnitude of the gradient fields are controlled to obtain this information. A suitable gradient coil configuration is illustrated in U.S. Pat. No. 4,355,282 to Young et al entitled "Nuclear Magnetic Resonance Systems". The subject matter of this patent is incorporated herein by reference.

FIG. 4A illustrates an energization waveform used for creating an encoding gradient field at a subject region of interest. When applied to electronics for energizing a gradient coil this signal would in theory produce a magnetic field of the desired amplitude and shape for phase encoding a magnetic imaging sequence. In the presence of conductive components such as the pulse coil 20 and circuitry coupled to the pulse coil, however, eddy currents are induced within the scanning aperture 18. The eddy currents result in magnetic field degradation. FIG. 4B, illustrates a typical gradient field similar to the input energization waveform in FIG. 4A yet differing in significant respects.

The present invention alters the input waveform to produce a modified input to energize the gradient coils. A typical modified input is seen in FIG. 4C. This input produces an output field similar to the input shown in FIG. 4A. This signal modification is accomplished by sensing magnetic field affects due to eddy currents within the scanning aperture 18 and modifying the input waveform to produce an output field such as that seen in FIG. 4D.

A circuit 40 for modifying the input waveform (FIG. 4A) is shown in FIG. 2. A waveform at an input 50 is generated by computer and converted to analog form by a digital-to-analog converter (not shown). The waveform is typically trapezoidal with amplitude and time duration appropriate to the requirements of the particular magnetic resonance pulse sequence utilized.

The input 50 is buffered by N+1 unity gain operational amplifier buffers 52. FIG. 2 illustrates a circuit with N=3. N buffers 52 drive low-pass filters 54 formed from resistor/capacitor pairs. The resistors 54r are variable allowing adjustment of filter time constants. The time constants are typical of those generated by eddy current effects. Variable gain amplifier buffers 56, having a gain of from 0 to 1 amplify outputs from the filters 54. Buffer outputs 55 are coupled to a summing operational amplifier 58 connected in an inverting mode. The variable gain amplifiers 56 allow weighting of the various time constants in a summed output. The adjustable resistor/capacitor networks emulate the effect of eddy currents on the original waveform.

The original trapezoidal input is also coupled to an amplifier 52 that drives the gradient coils ("DIRECT OUTPUT") The gradient field dBz/dx (or y, or z) is sensed using a search coil 57 (FIG. 1) placed in the cavity 18 with the imaging electronics and coils (gradient and rf) in their scanning position. The search coil 57 has 1000 turns of wire with a 20 cm diameter. An output from the search coil is integrated to give a field profile.

A suitable integrator 61 for shaping the search coil output is shown in FIG. 3. The integrator comprises an operational amplifier 62 with an input 63 and output 64 coupled together by a feedback charging capacitor 65. The integrator output 64 is input to one channel of a dual channel oscilloscope 67 (FIG. 1), a summed output 59 (FIG. 2) of the summing amplifier 58 is input to a second channel of this oscilloscope 67. The sensitivity (gain) controls are adjusted to give substantially the same amplitude on the oscilloscope display for each input. The input 63 from the search coil 57 is used to trigger the sweep rate of the oscilloscope 67 via a one shot 72. If the oscilloscope is placed in "sum" mode, it is possible to adjust the display to give a substantially zero trace (since the summing amplifier output 59 is of opposite sign to the integrator output 64) by manual adjustment of the RC circuits 54 and amplifiers 56. Once this substantially zero output has been achieved the circuit is calibrated. This means that the summed output 59 from the circuit 40 models the field (FIG. 4B) produced by the uncorrected waveform (FIG. 4C).

The calibrated summing amplifier output 59 is fed to a second summing amplifier 66 along with the original amplified waveform "DIRECT OUTPUT". Since the output from the first summing amplifier 58 is a signal opposite in sign to the original input 50, summing these two signals subtracts the RC filtered signal from the original signal to produce a difference signal. This difference signal is then added to the original signal by a third summing amplifier 68. An output 70 of this third summing amplifier 68 is a waveform (FIG. 4C) which produces a field profile (FIG. 4D) substantially equivalent to the original input waveform (FIG. 4A). Thus, to tune the circuit 40 the "DIRECT OUTPUT" is used to drive the gradient coils to calibrate the scanner 10. When imaging performed the signal labeled "OUTPUT" 70 from the amplifier 68 is used to drive a gradient coil. Since the scanner 10 has coils for producing three mutually orthogonal gradient fields, three calibration tests are required.

The FIG. 2 circuit will correct for any gradient waveform and avoids the necessity of conducting a different computer modeling procedure for each new gradient energization signal. While the present invention has been described with a degree of particularity it is the intent that the invention include all modifications and/or alterations falling within the spirit or scope of the appended claims.

I claim:

1. A method of magnetic resonance imaging a region of interest of a subject in an imaging region, the method comprising:
before positioning the subject in the image region, calibrating gradient magnetic fields by:
positioning a magnetic field sensing coil means in the image region;
energizing a field producing means with a gradient energization profile to create a resultant gradient field which differs from a preselected gradient field by errors attributable at least in part to eddy current fields caused by energizing the field producing means;
with the sensing coil means, sensing the resultant gradient field including the eddy current fields caused by energizing the field producing means;
providing an initial correction signal;
combining the energization profile with the correction signal;
comparing the sensed resultant gradient field with the combined energization profile and correction signal;
adjusting the correction signal to optimize a preselected relationship between the sensed resultant gradient field and the combined energization profile and correction signal;
positioning the region of interest of the subject in the image region;
energizing the field producing means with the preselected gradient energization profile combined with the adjusted correction signal to produce a corrected resultant gradient field, whereby the region of interest is imaged utilizing gradient fields which optimally approximate the preselected gradient field.

2. The method as set forth in claim 1 wherein the correction signal adjusting step includes adjusting a time constant of a plurality of RC filter circuits and a gain of variable gain amplifiers to produce correction signal components which correspond to each of a plurality of different frequency eddy current field components, and summing the correction signal components.

3. A method of magnetic resonance imaging comprising:
prior to imaging a subject, deriving a correction signal which is summed with a selected gradient energization profile during subsequent imaging to produce a resultant gradient field which optimally approximates a preselected gradient field, the correction signal deriving including:
energizing a field producing means with a preselected gradient energization profile and sensing a resultant gradient field which includes a plurality of eddy current field components caused by the energizing,
integrating the sensed resultant gradient field,
selecting RC time constants and gains for a plurality of correction signal components, each of the correction signal components corresponding to an eddy current field component,
summing the correction signal components to produce the correction signal,
comparing the integrated resultant gradient field and the summed correction signal components and,
adjusting the RC time constants and the gains until a selected, correspondence between the integrated eddy current field components and the summed correction signal components is achieved, whereby the correction signal is optimized,
during a subsequent imaging, modifying the selected gradient energization profile with the adjusted time constants and gains to create a corrected gradient field energization profile.

4. A magnetic resonance apparatus comprising:
main magnetic field means for generating a substantially uniform magnetic field in an imaging region;
a gradient field means for imposing a gradient field of a selected magnitude and direction on the substantially uniform magnetic field in the imaging region;
a gradient profile means for producing a gradient profile for causing the magnetic field gradient means to impose a resultant gradient field, which resultant gradient field differs from a preselected gradient field by errors attributable at least in part to eddy current induced errors;
a means for selectively exciting magnetic resonance in the image region;

a means for monitoring the induced magnetic resonance and producing an image indicative thereof;

a gradient profile calibration means for modifying the gradient profile in order to bring the resultant and preselected gradient fields into greater conformity, the calibration means including:

a correction signal means for adding a correction signal to the gradient profile, the correction signal means including a plurality of adjustable frequency filters and a plurality of variable gain amplifiers for providing correction signal components;

a search coil means disposed in the imaging region for sensing the resultant gradient field and producing a search coil signal indication thereof;

an integrating means for integrating the search coil signal;

a comparing means for comparing the integrated search coil signal with the components of the correction signal, the adjustable filter circuits, and the variable gain amplifiers being adjustable in accordance with the comparison of the comparing means, whereby the correction signal components are adjustable to improve the conformity between the resultant and preselected gradient fields.

5. The apparatus as set forth in claim 4 wherein the correction signal means has an input which is operatively connected with the gradient profile means to receive the gradient profile therefrom and with a summing means which sums the correction signal and the gradient profile, the summing means being connected with the gradient field means.

* * * * *